(12) United States Patent
Nemoto et al.

(10) Patent No.: US 12,368,435 B2
(45) Date of Patent: Jul. 22, 2025

(54) GATE DRIVE CIRCUIT

(71) Applicant: Mitsubishi Electric Corporation, Tokyo (JP)

(72) Inventors: Yuji Nemoto, Tokyo (JP); Kohei Onda, Tokyo (JP); Takayoshi Miki, Tokyo (JP); Shota Morisaki, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 64 days.

(21) Appl. No.: 18/568,294

(22) PCT Filed: Jun. 16, 2021

(86) PCT No.: PCT/JP2021/022791
§ 371 (c)(1),
(2) Date: Dec. 8, 2023

(87) PCT Pub. No.: WO2022/264299
PCT Pub. Date: Dec. 22, 2022

(65) Prior Publication Data
US 2024/0275376 A1  Aug. 15, 2024

(51) Int. Cl.
*H03K 17/16* (2006.01)
*H02M 1/00* (2006.01)
(Continued)

(52) U.S. Cl.
CPC ........ *H03K 17/168* (2013.01); *H02M 1/0054* (2021.05); *H02M 1/08* (2013.01); *H02M 7/5387* (2013.01); *H03K 17/161* (2013.01)

(58) Field of Classification Search
None
See application file for complete search history.

(56) References Cited

U.S. PATENT DOCUMENTS

| | | | |
|---|---|---|---|
| 5,089,719 A | 2/1992 | Kamei et al. | |
| 10,033,377 B2 * | 7/2018 | Liang | ................. H03K 17/0828 |

(Continued)

FOREIGN PATENT DOCUMENTS

| | | |
|---|---|---|
| JP | H03-117211 A | 5/1991 |
| JP | 2004-032410 A | 1/2004 |

(Continued)

OTHER PUBLICATIONS

International Search Report and Written Opinion mailed on Aug. 3, 2021, received for PCT Application PCT/JP2021/022791, filed on Jun. 16, 2021, 12 pages including English Translation.

(Continued)

*Primary Examiner* — Jeffrey S Zweizig
(74) *Attorney, Agent, or Firm* — XSENSUS LLP

(57) ABSTRACT

A control unit of a gate drive circuit applies, between a gate and a source of a switching element, a first voltage so as to turn on the switching element. After transference of drain current of the switching element, the control unit interrupts the first voltage and applies, between the gate and the source of the switching element, a second voltage that is lower than the first voltage and that is higher than a mirror voltage of the switching element. When no short-circuit current is flowing to the switching element, the control unit interrupts the second voltage and applies, between the gate and the source of the switching element, a third voltage higher than the second voltage.

20 Claims, 8 Drawing Sheets

(51) Int. Cl.
*H02M 1/08* (2006.01)
*H02M 7/5387* (2007.01)

(56) References Cited

U.S. PATENT DOCUMENTS

| | | | |
|---|---|---|---|
| 10,727,729 B2 * | 7/2020 | Nakashima | H02M 1/44 |
| 10,790,813 B2 * | 9/2020 | Mukunoki | G01R 31/2812 |
| 2004/0036511 A1 | 2/2004 | Otoshi et al. | |
| 2007/0252635 A1 | 11/2007 | Otoshi et al. | |
| 2010/0148846 A1 | 6/2010 | Hiyama | |
| 2014/0253184 A1 | 9/2014 | Yamauchi et al. | |
| 2018/0316182 A1 | 11/2018 | Minagawa | |
| 2024/0006976 A1 * | 1/2024 | Kurachi | H02M 7/53871 |

FOREIGN PATENT DOCUMENTS

| | | |
|---|---|---|
| JP | 2007-174134 A | 7/2007 |
| JP | 2009-071956 A | 4/2009 |
| JP | 2012-217087 A | 11/2012 |
| JP | 2014-147237 A | 8/2014 |
| JP | 2014-176228 A | 9/2014 |
| JP | 2015-019456 A | 1/2015 |
| JP | 2017-103879 A | 6/2017 |
| JP | 2018-186691 A | 11/2018 |
| WO | 2013/038775 A1 | 3/2013 |

OTHER PUBLICATIONS

Notice of Reasons for Refusal mailed on Nov. 24, 2021, received for JP Application 2021-559393, 19 pages including English Translation.

* cited by examiner

GATE DRIVE CIRCUIT

CROSS-REFERENCE TO RELATED APPLICATION

This application is based on PCT filing PCT/JP2021/022791, filed Jun. 16, 2021, the entire contents of which are incorporated herein by reference.

TECHNICAL FIELD

The present disclosure relates to a gate drive circuit.

BACKGROUND ART

As switching devices used for a power conversion device or the like, for example, semiconductor elements such as insulated-gate bipolar transistors (IGBTs) or metal-oxide-semiconductor field-effect transistors (MOSFETs) are used. These switching devices receive output voltages from drive circuits and perform switching operations. When each of these switching devices is turned on or turned off, the switching device experiences switching loss.

If the switching loss is decreased, power consumption of the power conversion device can be decreased, whereby the efficiency at the time of power conversion is improved. Therefore, in order to realize downsizing and efficiency improvement of the power conversion device, it is desirable to decrease the switching loss in the switching device.

The switching loss can be decreased by increasing the switching speed. The switching speed can be increased by hastening a voltage change at around a gate threshold voltage of the switching device.

As a method for decreasing the switching loss, a method has been disclosed in which a first voltage higher than an ordinarily-applied voltage is applied at first to realize high-speed switching, and, at a predetermined timing after a switching element is turned on, change is performed such that the voltage at a gate terminal of the switching element becomes a second voltage lower than the voltage of a first voltage source, thereby increasing the switching speed at the time of turn-on (see, for example, Patent Document 1).

Meanwhile, at the timing of turn-on, short-circuit fault sometimes occurs owing to abnormality of a control circuit and failure of a switching element that forms a pair. Consequently, the switching element might be broken. If the gate voltage of the switching element is high, large current flows through the switching element at the time of the short-circuit fault. In view of this, a method has been disclosed in which a first voltage lower than an ordinarily-applied voltage is applied at first to limit current that flows at the time of short-circuit fault and ensure short-circuit withstand capability, and, at a predetermined timing after a switching element is normally turned on, change is performed such that the voltage at a gate terminal of the switching element becomes a second voltage higher than the voltage of a first voltage source in order to decrease steady conduction loss (see, for example, Patent Document 2).

CITATION LIST

Patent Document

Patent Document 1: Japanese Laid-Open Patent Publication No. 2007-174134

Patent Document 2: Japanese Laid-Open Patent Publication No. 2009-071956

SUMMARY OF THE INVENTION

Problem to be Solved by the Invention

In the method disclosed in Patent Document 1, since the gate voltage of the switching element is high, the switching loss is decreased, but the switching element might be broken owing to short-circuit fault that might occur at the timing of turn-on.

In the method disclosed in Patent Document 2, since the initial gate voltage at the time of turn-on is low, current that flows at the time of short-circuit fault can be limited, but a problem arises in that the switching loss increases.

Thus, decrease of switching loss and ensuring of short-circuit withstand capability are in a trade-off relationship.

The present disclosure has been made to solve the above problems, and an object of the present disclosure is to provide a gate drive circuit, for a switching element, that can achieve both decrease of switching loss and ensuring of short-circuit withstand capability.

Means to Solve the Problem

A gate drive circuit according to the present disclosure is a gate drive circuit including a control unit which applies, between a gate and a source of a switching element to be driven, a gate voltage and drives the switching element. The control unit applies, between the gate and the source of the switching element, a first voltage from a first power supply so as to turn on the switching element. After transference of drain current of the switching element, the control unit interrupts the first voltage and applies, between the gate and the source of the switching element, a second voltage that is lower than the first voltage and that is higher than a mirror voltage of the switching element from a second power supply different from the first power supply so as to decrease a voltage between the gate and the source of the switching element to the second voltage from the first voltage or a voltage equal to or higher than the second voltage. When no short-circuit current is flowing to the switching element to be driven, the control unit interrupts the second voltage and applies, between the gate and the source of the switching element, a third voltage higher than the second voltage.

Effect of the Invention

In the gate drive circuit according to the present disclosure, at the time of turn-on, switching is performed at a high voltage so that switching loss is decreased. Furthermore, even if short-circuit current occurs as a result of the turn-on, the gate voltage is immediately decreased to be low so that the short-circuit current can also be decreased, whereby short-circuit withstand capability can also be ensured. Moreover, the gate voltage is increased thereafter, whereby steady conduction loss can also be decreased to be low.

DESCRIPTION OF EMBODIMENTS

Figure 1:
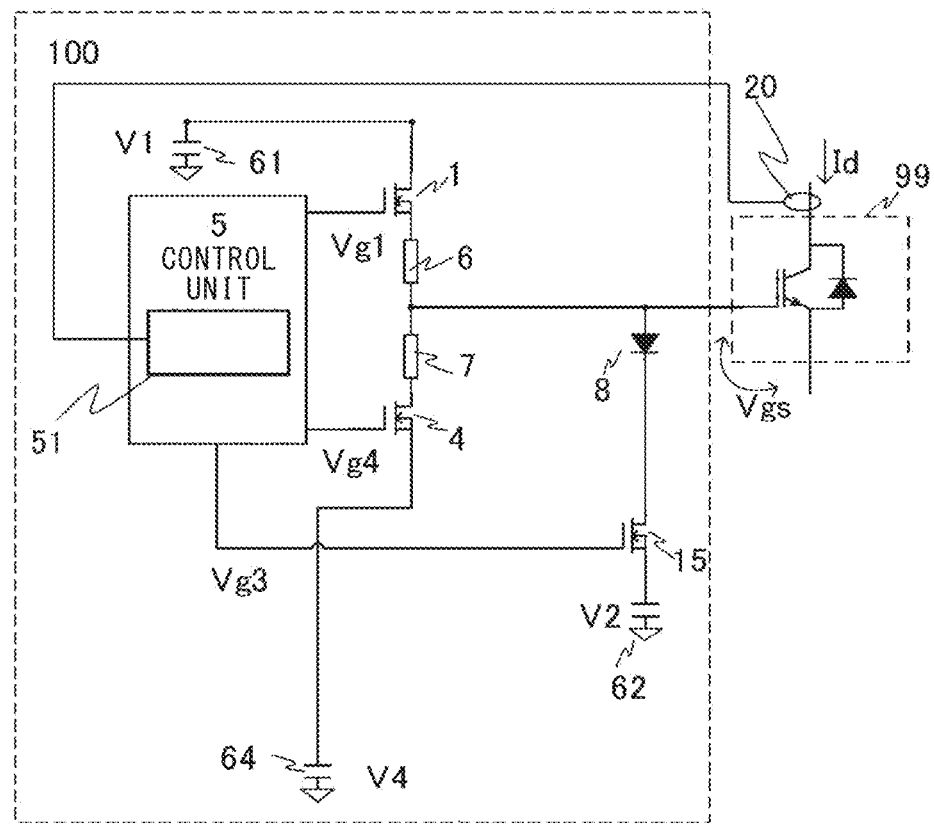
FIG. 1 is a circuit configuration diagram schematically showing a gate drive circuit according to embodiment 1.

Hereinafter, the present embodiments will be described with reference to the drawings. In the drawings, the same or corresponding parts are denoted by the same reference characters. Also, FIG. 1 to FIG. 9 are related to embodiments, and the present disclosure is not limited by these drawings.

Embodiment 1

Hereinafter, a gate drive circuit according to embodiment 1 will be described with reference to FIG. 1.

Figure 2:
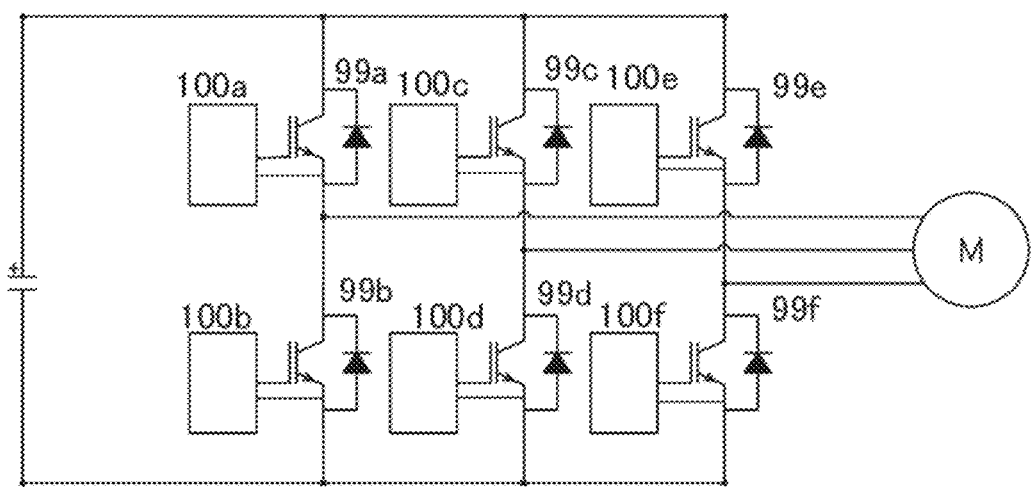
FIG. 2 shows an example of a power conversion system to which the gate drive circuits according to embodiment 1 and switching elements to be driven have been applied.

FIG. 1 is a circuit configuration diagram schematically showing the gate drive circuit according to embodiment 1. FIG. 2 shows an example of a power conversion system to which the gate drive circuits and switching elements to be driven have been applied.

Regarding a gate drive circuit 100 shown in FIG. 1, without limitation to the present embodiment 1, any of gate drive circuits according to other embodiments can be used for various power converters. For example, the gate drive circuit can be used as each of the gate drive circuits of the power conversion system shown in FIG. 2. An example of the power conversion system shown in FIG. 2 is a three-phase inverter system in which AC power from a grid power supply is rectified to DC power by a rectification circuit, and then the DC power is converted into AC power to be outputted to a motor as a load, or the like. Here, each of gate drive circuits 100a, 100b, 100c, 100d, 100e, and 100f and each of switching elements 99a, 99b, 99c, 99d, 99e, and 99f in FIG. 2 correspond to a gate drive circuit 100 and a switching element 99 in any of FIG. 1, and FIG. 5 and FIG. 7 described later.

In the drawings, an insulated-gate bipolar transistor (IGBT) which is a representative power semiconductor element is used as the switching element 99 to be driven by the gate drive circuit 100. However, the switching element 99 to be driven is not limited to an IGBT and may be another voltage-driven switching element such as a metal-oxide-semiconductor field-effect transistor (MOSFET). It is noted that a diode is connected in antiparallel to the IGBT. Meanwhile, if the switching element 99 is an MOSFET, it is also possible to use a body diode of the MOSFET instead.

Next, a detailed configuration of the gate drive circuit 100 for the switching element 99 to be driven will be described. In FIG. 1, a first power supply 61 for applying a positive voltage to a gate terminal of the switching element 99 is connected to the gate terminal of the switching element 99 via a switching element 1 and a gate resistor 6 for adjusting a switching speed. In addition, in order to apply a second power supply voltage V2 to the gate terminal of the switching element 99, a diode 8, a switching element 15, and a second power supply 62 are connected in series to the gate terminal. Furthermore, a fourth power supply 64 for applying a negative voltage to the gate terminal of the switching element 99 is connected to the gate terminal of the switching element 99 via a switching element 4 and a gate resistor 7 for adjusting the switching speed. Here, an example in which each of the switching elements 1, 4, and 15 is an MOSFET is shown.

It is noted that each of the power supplies is a DC power supply, and voltages V1, V2, and V4 applied to the gate terminal from the respective power supplies 61, 62, and 64 satisfy the following relationship.

$$V1 > V2 > \text{mirror voltage of switching element } 99 > V4$$

Here, the voltage V1 is defined as a voltage that should be applied in an ON state and that is set for each switching element 99. The voltage V4 is a negative voltage and is a voltage of about, for example, −5 to −15 V.

In FIG. 1, the gate drive circuit 100 further has a control unit 5 which controls each of the switching elements 1, 4, and 15 in order to control the voltage to be applied to the gate terminal of the switching element 99. The control unit 5 includes a short-circuit current detection unit 51 which performs, on the basis of an output from a current detector 20 for current flowing to the switching element 99, detection as to whether short-circuit current is flowing to the switching element 99.

Next, operation of the gate drive circuit 100 will be described with reference to a timing chart in FIG. 3. The drawing is a timing chart showing, in order from the top, a gate voltage Vgs which is the voltage between a gate and a source, a drive signal Vg1 for turning on/off the switching element 1, a drive signal Vg4 for turning on/off the switching element 4, a drive signal Vg3 for turning on/off the switching element 15, drain current Id of the switching element 99, and a drain-source voltage Vds of the switching element 99.

At a time point t0, the drive signal Vg1 becomes high (H) so as to turn on the switching element 1. Consequently, the first voltage V1 is applied for the gate voltage Vgs via the gate resistor 6, and the switching element 99 is turned on at an ordinary switching speed. Here, the ordinary switching speed refers to a switching speed when turn-on is performed at the voltage V1 that should be applied in an ON state.

At a time point t1, the gate voltage Vgs reaches a mirror voltage, and consequently, the drain current Id of the switching element 99 gradually increases and, at a time point t2, reaches a current that should originally be caused to flow. Here, the current that should originally be caused to flow refers to a current determined according to input voltage, the state of the motor, or the like, and the drain current Id increases to a current that has been flowing through a pair-forming arm having been in an ON state until just before. At this point, transference of the drain current Id is completed.

Thereafter, the drain-source voltage Vds decreases and, at a time point t3, reaches 0 V, and turn-on of the switching element 99 is normally ended. In addition, the gate voltage Vgs increases to the first voltage V1 between the time point t2 and the time point t3. Although an example in which the gate voltage Vgs becomes the first voltage V1 between the time point t2 and the time point t3 has been described here, the present disclosure is not limited to this example. That is, the gate voltage Vgs only has to become a voltage equal to or higher than the second voltage V2 between the time point t2 and the time point t3.

At the timing of completion of switching (time point t3), the drive signal Vg1 is set to be low (L) so as to turn off the switching element 1. At the same time, the drive signal Vg3 is set to be high (H) so as to turn on a gate of the switching element 15. Consequently, the gate voltage Vgs decreases to the second voltage V2 (at a time point t4).

The state where the gate voltage Vgs is the second voltage V2 is maintained until a time point t5. This time period is provided in consideration of a delay time period, of the circuit, for performing detection as to whether short-circuit current is flowing to the switching element 99. That is, the state of being the second voltage V2 is maintained for the delay time period for the short-circuit current detection unit 51.

Since the gate voltage Vgs decreases to the second voltage V2 lower than the first voltage V1, this decrease causes increase of the conduction loss in the switching element 99. However, the period from the time point t4 to the time point t5 is about several microseconds, and there is little influence on the loss. Furthermore, since the gate voltage Vgs is decreased after switching is completed, deterioration regarding switching loss does not occur, either.

If the short-circuit current detection unit 51 determines that no short-circuit current is flowing to the switching element 99, i.e., no short-circuit has occurred, the drive signal Vg3 is set to be low (L) at the time point t5 so as to turn off the switching element 15. At the same time, the drive signal Vg1 is set to be high (H) again so as to turn on a gate of the switching element 1. Consequently, the first voltage V1 is applied for the gate voltage Vgs again via the gate resistor 6, and thus the switching element 99 continues to be operated at an ordinary conduction loss.

Although not shown in the drawing, the drive signal Vg1 is set to be low (L) so as to turn off the switching element 1 at the time of turning off the switching element 99. At the same time, the drive signal Vg4 is set to be high (H) so as to turn on a gate of the switching element 4. Consequently, the fourth voltage V4 which is a negative voltage is applied for the gate voltage Vgs via the gate resistor 7, and also, the drain current Id becomes 0. This state corresponds to a state taken before the time point t0.

Figure 3:
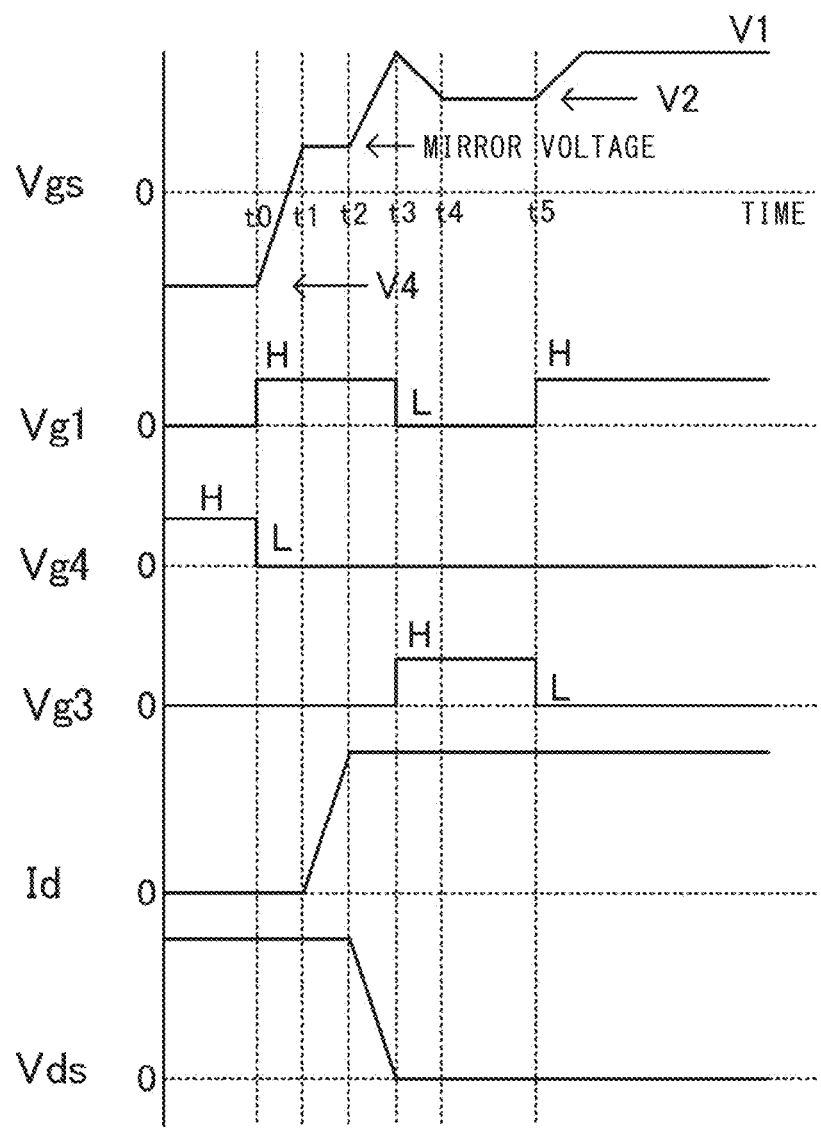
FIG. 3 is a timing chart showing operation of the gate drive circuit according to embodiment 1.

The timing chart in FIG. 3 shows an example in which no short-circuit current has been detected. Next, operation in the case where short-circuit current has been detected will be described with reference to FIG. 4.

Figure 4:
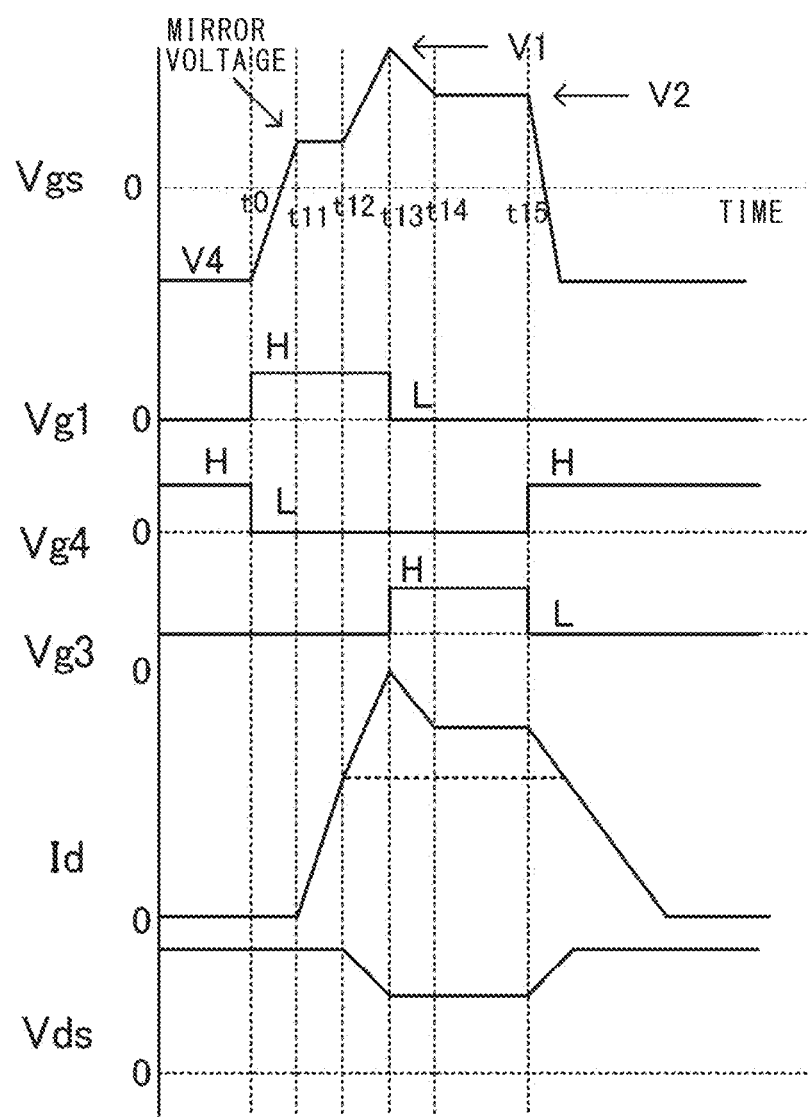
FIG. 4 is another timing chart showing operation of the gate drive circuit according to embodiment 1.

In FIG. 4, events from the time point t0 to a time point t12 are the same as those from the time point t0 to the time point t2 in FIG. 3. That is, at the time point t0, the drive signal Vg1 becomes high (H) so as to turn on the switching element 1. Consequently, the first voltage V1 is applied for the gate voltage Vgs via the gate resistor 6, and the switching element 99 is turned on at the ordinary switching speed.

At a time point t11, the gate voltage Vgs reaches the mirror voltage, and consequently, the drain current Id of the switching element 99 gradually increases and, at the time point t12, reaches the current that has been flowing through the pair-forming arm, and transference of the drain current Id is completed.

Here, if there is abnormality in a switching element 99 forming a pair with this switching element 99 and a state where short-circuit has occurred is maintained, the drain current Id further increases as in a period subsequent to the time point t12 in FIG. 4, and this leads to a state where short-circuit fault has occurred. Here, if, for example, the power conversion system is configured as in FIG. 2, the switching element 99b is a switching element that forms a pair with the switching element 99a. It is noted that a short-circuit withstand capability is set for each switching element 99, and thus the switching element 99 is not immediately broken even when the drain current Id starts to increase. When loss becomes excessive as a result of continuation of this state for a long time, the switching element ends up being broken.

Upon completion of transference of the drain current Id, the drive signal Vg1 is set to be low (L) so as to turn off the switching element 1. At the same time, the drive signal Vg3 is set to be high (H) so as to turn on the gate of the switching element 15. Consequently, the gate voltage Vgs decreases to the second voltage V2 (at a time point t14). Decrease in the gate voltage Vgs makes it possible to limit the drain current Id, and likewise, suppress loss generated owing to short-circuit fault. Therefore, decrease in the gate voltage Vgs leads to elongation of the time period in which short-circuit current can be kept flowing, whereby a time period for determination as to short-circuit fault can be ensured. Since the gate voltage Vgs is decreased after switching is completed, there is no influence on switching loss.

The state where the gate voltage Vgs is the second voltage V2 is maintained until a time point t15. As described above, detection as to whether short-circuit current is flowing to the switching element 99 is performed during this time period.

If the short-circuit current detection unit 51 determines that short-circuit has occurred, the drive signal Vg3 is set to be low (L) at the time point t15 so as to turn off the switching element 15. At the same time, the drive signal Vg4 is set to be high (H) so as to turn on the gate of the switching element 4. Consequently, the fourth voltage V4 which is a negative voltage is applied for the gate voltage Vgs via the gate resistor 7, and the switching element 99 is turned off. Thus, the switching element 99 can be normally caused to stop operating, before the switching element 99 is broken.

As described above, the gate drive circuit according to embodiment 1 includes the control unit 5 which controls the gate voltage Vgs of the switching element 99 to be driven and which drives the switching element 99. The control unit 5 is configured to control the gate voltage Vgs by applying, to the gate of the switching element 99, any one of at least three types of voltages, i.e., the first voltage V1, the second voltage V2, and the fourth voltage V4 which is a negative voltage. Further, at the time of turning on the switching element 99, switching is performed at the high first voltage V1 so that the switching loss is decreased. Furthermore, even if short-circuit current occurs as a result of the turn-on, the gate voltage Vgs is immediately decreased to be low (second voltage V2) so that the short-circuit current can be decreased, whereby the short-circuit withstand capability can be ensured. Here, if no short-circuit current has occurred, the gate voltage Vgs is set to be the first voltage V1 thereafter, whereby the steady conduction loss can also be decreased to be low. Meanwhile, if short-circuit current has occurred, the gate voltage Vgs is changed from the second voltage V2 to the fourth voltage V4 which is a negative voltage, whereby the switching element 99 is turned off, and operation can be ended before the switching element 99 is broken.

Embodiment 2

Hereinafter, a gate drive circuit according to embodiment 2 will be described with reference to the drawings. Embodiment 2 is an example in which the switching element 99 is turned on at a voltage that is even higher than the first voltage V1 used in embodiment 1.

Figure 5:
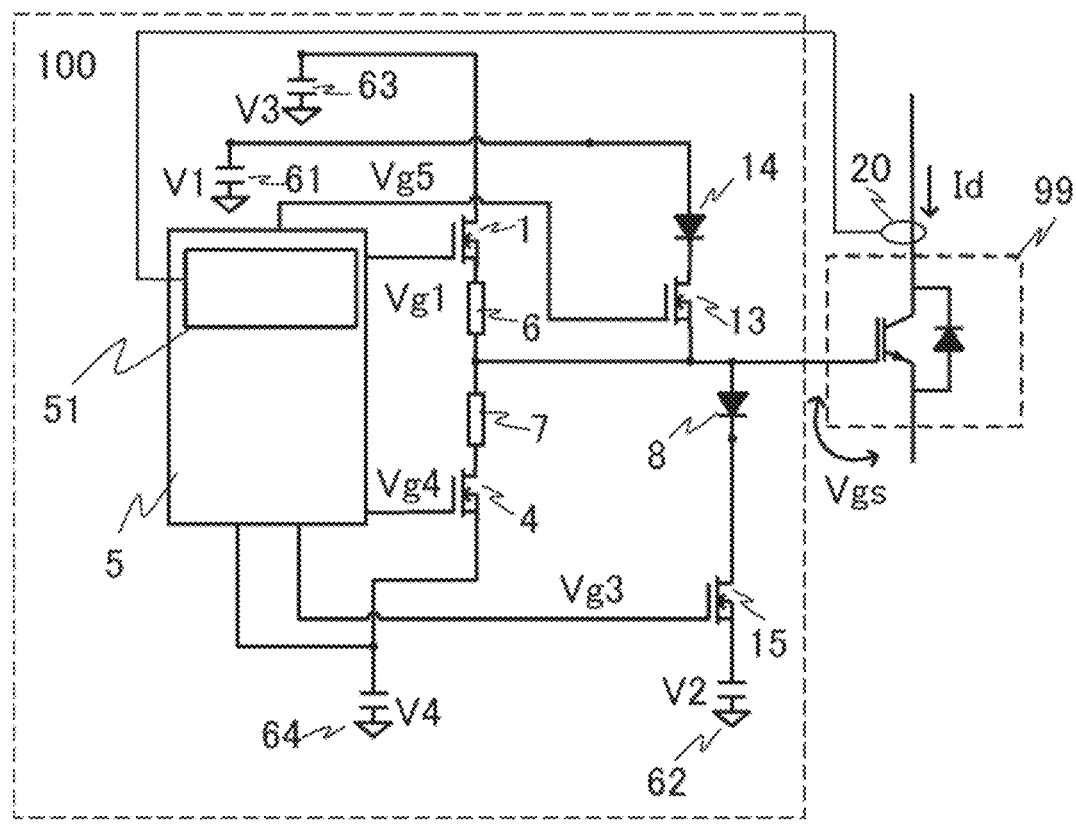
FIG. 5 is a circuit configuration diagram schematically showing a gate drive circuit according to embodiment 2.
Figure 6:
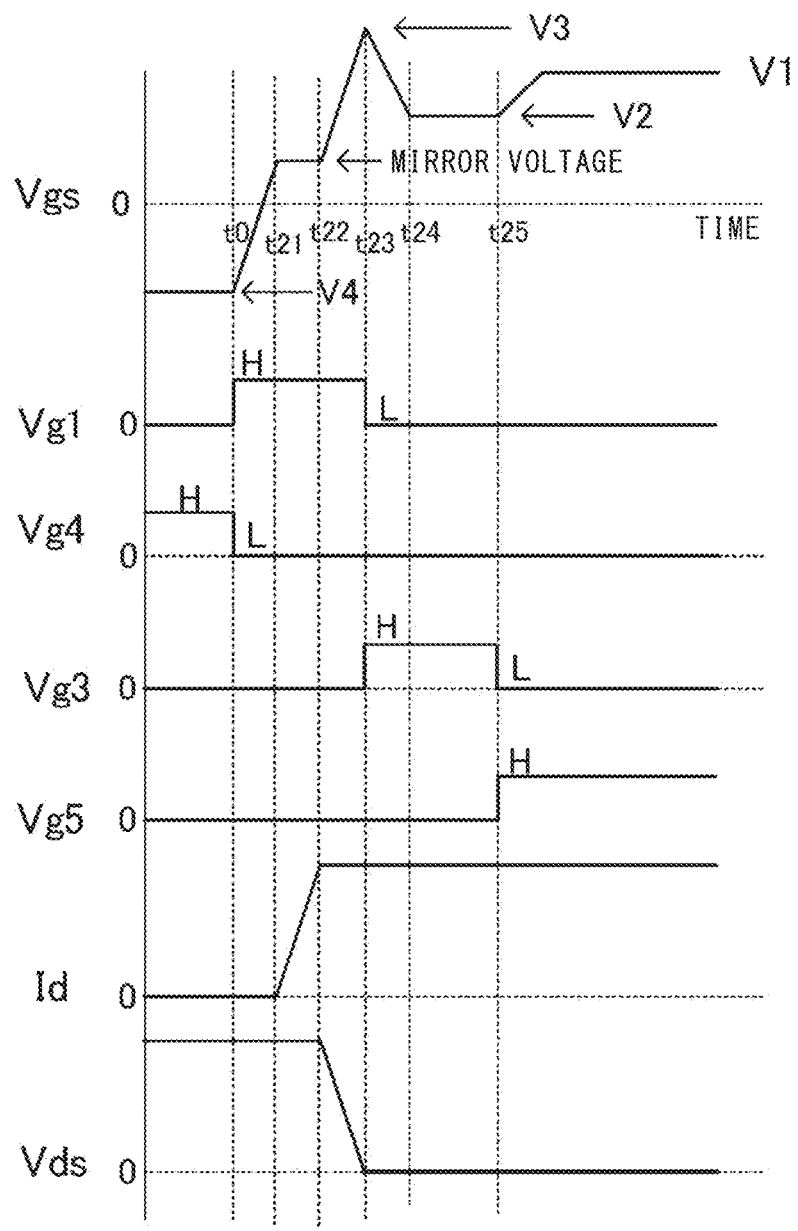
FIG. 6 is a timing chart showing operation of the gate drive circuit according to embodiment 2.

FIG. 5 is a circuit configuration diagram schematically showing the gate drive circuit according to embodiment 2. FIG. 6 is a timing chart showing operation of the gate drive circuit.

In FIG. 5, a power supply 63 which supplies a third voltage V3 higher than the first voltage V1 is connected to one end of the switching element 1. In addition, the power supply 61 which supplies the first voltage V1 is connected in series to a diode 14 and a switching element 13 and connected to the gate terminal of the switching element 99. The other components are the same as those in FIG. 1 regarding embodiment 1, and thus will not be described.

It is noted that each of the power supplies is a DC power supply, and voltages V1, V2, V3, and V4 applied to the gate terminal from the respective power supplies 61, 62, 63, and 64 satisfy the following relationship.

$$V3 > V1 > V2 > \text{mirror voltage of switching element } 99 > V4$$

Here, the voltage V1 is defined as a voltage that should be applied in an ON state and that is set for each switching element 99, and the voltage V3 is a voltage higher than the voltage V1, i.e., higher than the voltage that should ordinarily be applied. The voltage V4 is a negative voltage.

Next, operation of the gate drive circuit 100 will be described with reference to the timing chart in FIG. 6. The drawing is a timing chart showing, in order from the top, the gate voltage Vgs which is the voltage between the gate and the source, the drive signal Vg1 for turning on/off the switching element 1, the drive signal Vg4 for turning on/off the switching element 4, the drive signal Vg3 for turning on/off the switching element 15, a drive signal Vg5 for turning on/off the switching element 13, the drain current Id of the switching element 99, and the drain-source voltage Vds of the switching element 99.

At the time point t0, the drive signal Vg1 becomes high (H) so as to turn on the switching element 1. Consequently, the third voltage V3 is applied for the gate voltage Vgs via the gate resistor 6, and the switching element 99 is turned on at a switching speed that is higher than that in an ordinary case, i.e., higher than that in a case where the voltage at the time of switching is the first voltage V1.

At a time point t21, the gate voltage Vgs reaches the mirror voltage, and consequently, the drain current Id of the switching element 99 gradually increases and, at a time point t22, reaches the current that has been flowing to the pair-forming arm. At this point, transference of the drain current Id is completed.

Thereafter, the drain-source voltage Vds decreases and, at a time point t23, reaches 0 V, and turn-on of the switching element 99 is normally ended. In addition, the gate voltage Vgs increases to the third voltage V3 between the time point t22 and the time point t23. It is noted that the gate voltage Vgs does not necessarily have to reach the third voltage V3 by the time point t23 at which the drain-source voltage Vds completely decreases.

Since the gate voltage Vgs is set to be high, the period from the time point t0 to the time point t23 is shorter than the period from the time point t0 to the time point t3 in embodiment 1, and the switching loss can be made lower than that in embodiment 1.

At the timing of completion of switching (time point t23), the drive signal Vg1 is set to be low (L) so as to turn off the switching element 1. At the same time, the drive signal Vg3 is set to be high (H) so as to turn on the gate of the switching element 15. Consequently, the gate voltage Vgs decreases to the second voltage V2 (at a time point t24).

The state where the gate voltage Vgs is the second voltage V2 is maintained until a time point t25. Similar to embodiment 1, detection as to whether short-circuit current is flowing to the switching element 99 is performed during this time period. That is, the state of being the second voltage V2 is maintained for the delay time period for the short-circuit current detection unit 51.

Since the gate voltage Vgs decreases to the second voltage V2 lower than the first voltage V1 that should ordinarily be applied, this decrease causes increase of the conduction loss in the switching element 99. However, the period from the time point t24 to the time point t25 is about several microseconds, and there is little influence on the loss. Furthermore, since the gate voltage Vgs is decreased after switching is completed, deterioration regarding switching loss does not occur, either.

If the short-circuit current detection unit 51 determines that no short-circuit current is flowing to the switching element 99, i.e., no short-circuit has occurred, the drive signal Vg3 is set to be low (L) at the time point t25 so as to turn off the switching element 15. At the same time, the drive signal Vg5 is set to be high (H) so as to turn on a gate of the switching element 13. Consequently, the gate voltage Vgs becomes the first voltage V1, whereby the switching element 99 continues to be operated at the ordinary conduction loss.

Although not shown in the drawing, the drive signal Vg5 is set to be low (L) so as to turn off the switching element 13 at the time of turning off the switching element 99. At the same time, the drive signal Vg4 is set to be high (H) so as to turn on the gate of the switching element 4. Consequently, the fourth voltage V4 which is a negative voltage is applied for the gate voltage Vgs via the gate resistor 7, and also, the drain current Id becomes 0. This state corresponds to the state taken before the time point t0.

The timing chart in FIG. 6 shows an example in which no short-circuit current has been detected. Meanwhile, operation in the case where short-circuit current has been detected is the same as that in FIG. 4 regarding embodiment 1. That is, at the time point t25 in FIG. 6, the drive signal Vg3 is set to be low (L) so as to turn off the switching element 15. At the same time, the drive signal Vg4 is set to be high (H) so as to turn on the gate of the switching element 4.

As described above, the gate drive circuit according to embodiment 2 exhibits the same advantageous effects as those in embodiment 1. Furthermore, the control unit 5 is configured to control the gate voltage Vgs by applying, to the gate of the switching element 99, any one of at least four types of voltages, i.e., the first voltage V1, the second voltage V2, the third voltage V3, and the fourth voltage V4 which is a negative voltage. Further, at the time of turning on the switching element 99, switching is performed at the third voltage V3 higher than that applied at the time of ordinary operation so that the switching loss is decreased. Furthermore, even if short-circuit current occurs as a result of the turn-on, the gate voltage Vgs is immediately decreased to be low (second voltage V2) so that the short-circuit current can be decreased, whereby the short-circuit withstand capability can be ensured. Here, if no short-circuit current has occurred, the gate voltage Vgs is set to be the first voltage V1 thereafter, whereby the steady conduction loss can also be decreased to be low. Meanwhile, if short-circuit current has occurred, the gate voltage Vgs is changed from the second voltage V2 to the fourth voltage V4 which is a negative output voltage, whereby the switching element 99 is turned off, and operation can be ended before the switching element 99 is broken.

In particular, if the switching element 99 to be driven is formed of a wide-bandgap semiconductor that is a compound semiconductor such as silicon carbide (Sic) or gallium nitride (GaN), the internal gate resistor is high, and, even if the external gate resistor 6 is set to 0Ω, the switching loss might be high. Although a certain advantageous effect is exhibited with the configuration in embodiment 1 as well, the advantageous effect of decreasing the switching loss becomes more significant by causing, at the time of switching, the gate voltage Vgs to be a voltage higher than that applied at the time of ordinary operation as in the present embodiment 2.

Embodiment 3

Hereinafter, a gate drive circuit according to embodiment 3 will be described with reference to the drawings.

The present embodiment 3 is an example of a circuit in which the voltage is decreased from the first voltage V1 to a second voltage V2a without using the second power supply in embodiment 1.

Figure 7:
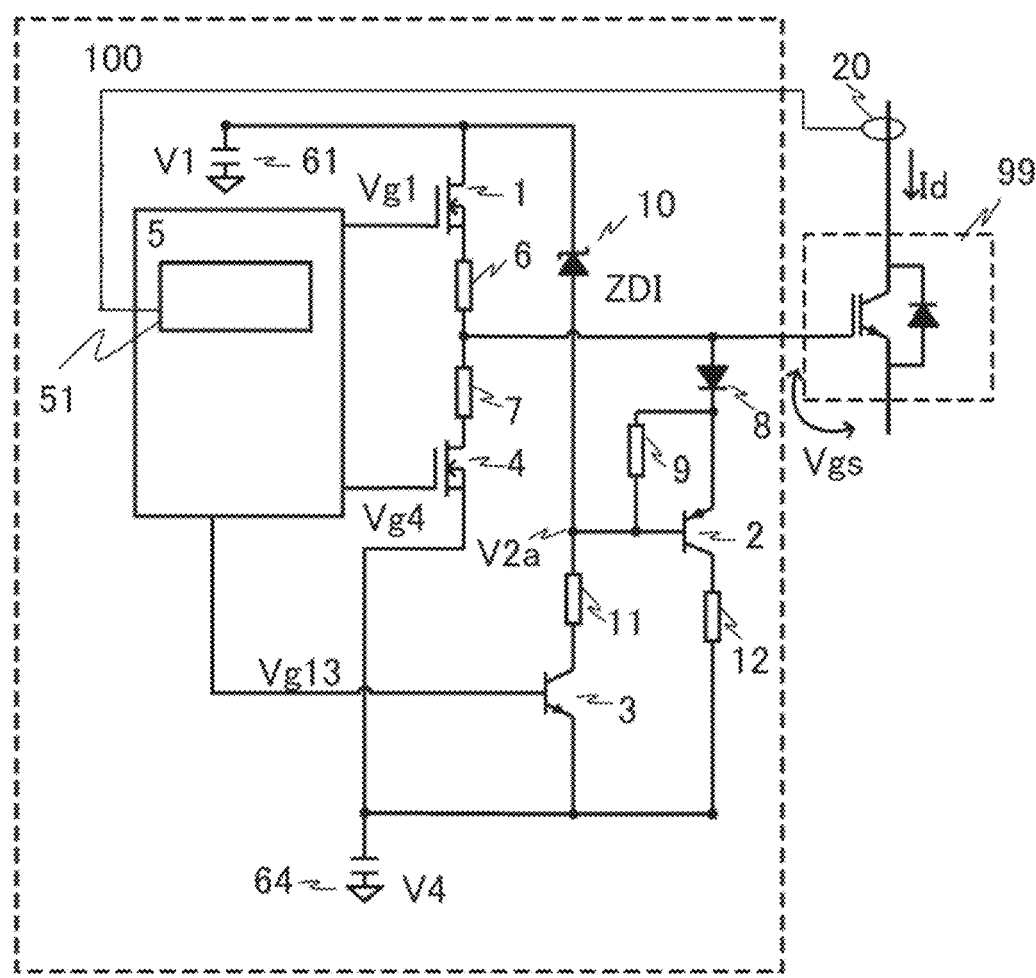
FIG. 7 is a circuit configuration diagram schematically showing a gate drive circuit according to embodiment 3.
Figure 8:
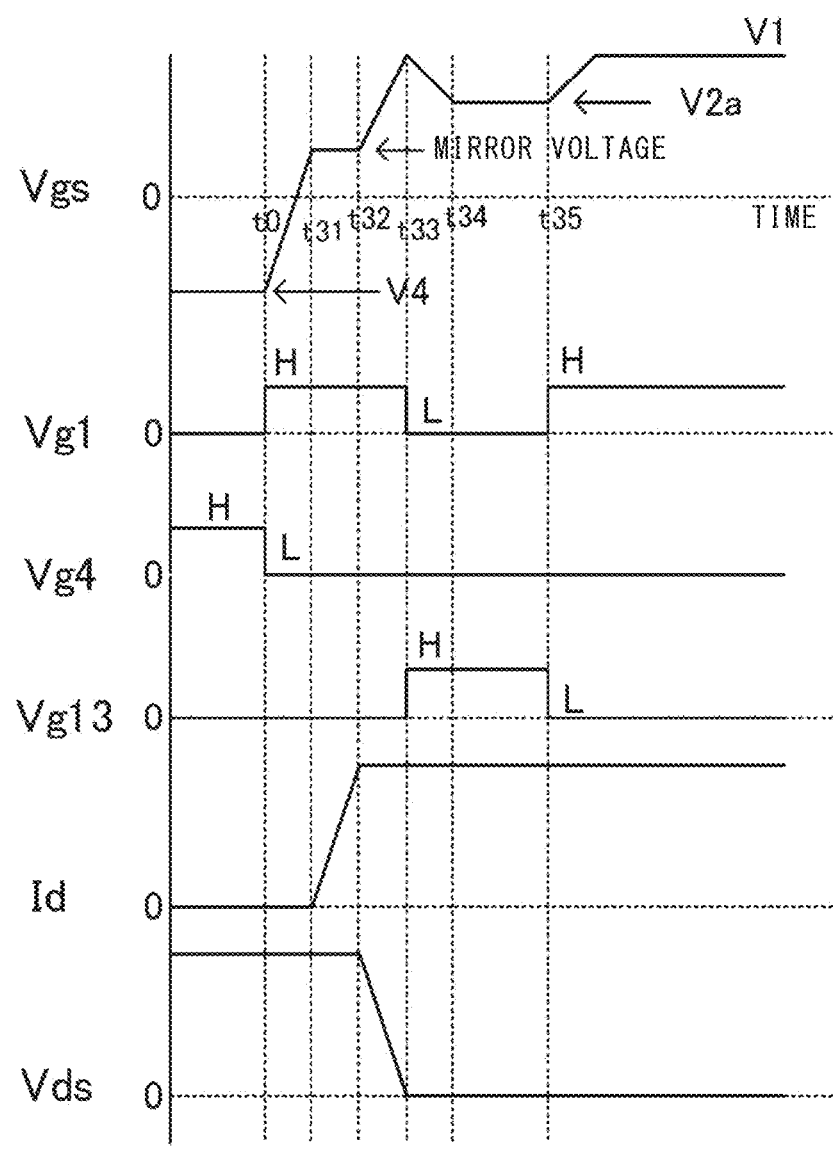
FIG. 8 is a timing chart showing operation of the gate drive circuit according to embodiment 3.

FIG. 7 is a circuit configuration diagram schematically showing the gate drive circuit according to embodiment 3. FIG. 8 is a timing chart showing operation of the gate drive circuit.

In FIG. 7, the diode 8, a transistor 2, and a resistor 12 for generating the second voltage V2a are connected in series to the gate terminal of the switching element 99, a Zener diode 10 for determining a voltage is connected via the power supply 61 to a base side of the transistor 2, a transistor 3 for turn-on/off thereof is connected via a resistor 11, and an emitter of the transistor 3 is connected to the power supply 64 (the voltage V4 thereof being a negative voltage).

In the timing chart in FIG. 8, events from the time point t0 to a time point t32 are the same as those from the time point t0 to the time point t2 in FIG. 3 regarding embodiment 1, and thus will not be described.

After transference of the drain current Id is completed at the time point t32, the drain-source voltage Vds decreases and, at a time point t33, reaches 0 V, and turn-on of the switching element 99 is normally ended.

At the timing of completion of switching (time point t33), the drive signal Vg1 is set to be low (L) so as to turn off the switching element 1. A drive signal Vg13 is set to be high (H) so as to turn on the transistor 3. Consequently, the emitter voltage of the transistor 2 decreases to a voltage lower than the first voltage V1, e.g., V2, the transistor 2 of a PNP type is turned on, and the second voltage V2a obtained through addition of a voltage Vbe between the base and the emitter of the transistor 2 is applied for the gate voltage Vgs of the switching element 99. Here, V2a=V2+Vbe is satisfied, and the voltage Vbe is about 1 V. That is, after turn-on is ended, the gate voltage Vgs can be decreased to the second voltage V2a lower than the first voltage V1 (at a time point t34) without using the power supply 62 described in each of embodiments 1 and 2. Subsequent operations and the operation in the case where short-circuit has been detected, are the same as those in embodiment 1, and will not be described.

As described above, the gate drive circuit according to embodiment 3 also exhibits the same advantageous effects as those in embodiment 1. In addition, the number of power supplies is smaller than that in embodiment 1, and thus the gate drive circuit can be configured at low cost.

Figure 9:
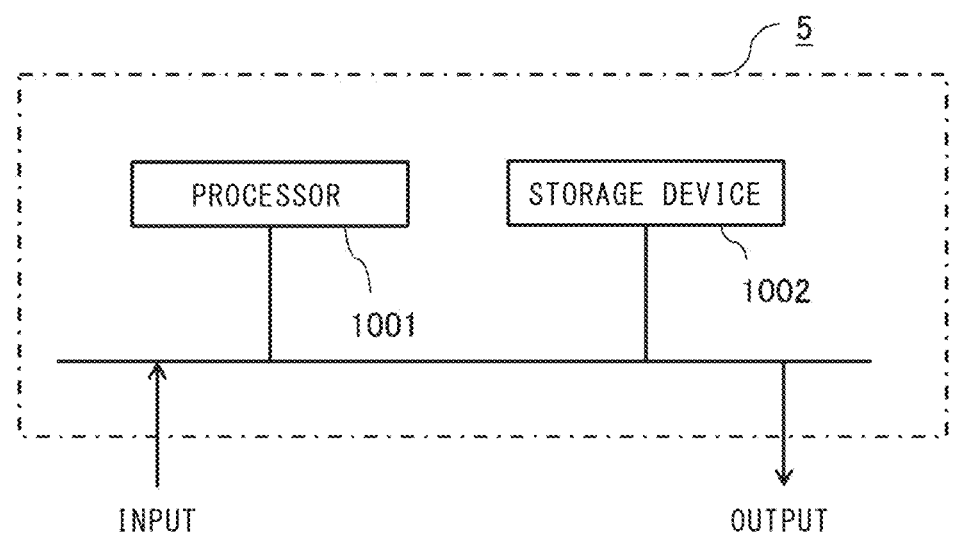
FIG. 9 is a hardware configuration diagram of a control unit provided to any of the gate drive circuits according to embodiments 1 to 3.

It is noted that the control unit 5 in each of embodiments 1 to 3 is composed of a processor 1001 and a storage device 1002, an example of hardware of the control unit 5 being shown in FIG. 9. Although not shown, the storage device includes a volatile storage device such as a random access memory and a nonvolatile auxiliary storage device such as a flash memory. Alternatively, the storage device may include, as the auxiliary storage device, a hard disk instead of a flash memory. The processor 1001 executes a program inputted from the storage device 1002. In this case, the program is inputted from the auxiliary storage device via the volatile storage device to the processor 1001. Further, the processor 1001 may output data such as a computation result to the volatile storage device of the storage device 1002 or may save the data via the volatile storage device into the auxiliary storage device.

Other Embodiments

In embodiments 1 to 3, the short-circuit current detection unit 51 which detects occurrence of abnormality such as short-circuit fault that involves flow of short-circuit current is provided in the control unit 5. However, the short-circuit current detection unit 51 may be provided outside of the control unit 5. If the short-circuit current detection unit 51 is provided outside of the control unit 5, configuring only has to be performed such that: a signal regarding presence/absence of short-circuit fault is inputted to the control unit 5; and the gate voltage Vgs is controlled on the basis of the signal.

In embodiments 1 to 3, the switching elements 1, 4, 13, and 15 in the gate drive circuits 100 have been described as being exemplified by MOSFETs. However, the switching elements may be other switching elements such as IGBTs.

The circuit configurations of the gate drive circuits described in embodiments 1 to 3 are not limited to those in the drawings presented as examples, and a circuit with, for example, any number of power supplies may be used as long as the circuit allows a plurality of different voltages to be applied, as the gate voltage Vgs, between the gate and the source of the switching element 99 to be driven.

Although the disclosure is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the specification of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE CHARACTERS 1, 4, 13, 15 switching element
2, 3 transistor
5 control unit 6, 7 gate resistor
8, 14 diode
9, 11, 12 resistor
10 Zener diode
20 current detector
51 short-circuit current detection unit
61, 62, 63, 64 power supply
99 switching element
100 gate drive circuit
1001 processor
1002 storage device
V1, V2, V3, V4 voltage

The invention claimed is:

1. A gate drive circuit comprising
a controller which applies, between a gate and a source of a switching element to be driven, a gate voltage and drives the switching element, wherein
the controller
applies, between the gate and the source of the switching element, a first voltage from a first power supply so as to turn on the switching element,
after transference of drain current of the switching element, interrupts the first voltage and applies, between the gate and the source of the switching element, a second voltage that is lower than the first voltage and that is higher than a mirror voltage of the switching element from a second power supply different from the first power supply so as to decrease a voltage between the gate and the source of the switching element to the second voltage from the first voltage or a voltage equal to or higher than the second voltage, and
when no short-circuit current is flowing to the switching element to be driven, interrupts the second voltage and applies, between the gate and the source of the switching element, a third voltage higher than the second voltage.

2. The gate drive circuit according to claim 1, wherein the controller determines, while the second voltage is being applied between the gate and the source of the switching element, whether short-circuit current is flowing to the switching element.

3. The gate drive circuit according to claim 1, wherein the third voltage is a voltage equal to the first voltage.

4. The gate drive circuit according to claim 3, further comprising:
a first gate resistor, a first switching element, and the first power supply which are connected in series to the gate of the switching element to be driven; and
a second switching element and the second power supply which are connected in series to the gate of the switching element to be driven, wherein
the controller
turns on the first switching element so as to apply, between the gate and the source of the switching element to be driven, the first voltage from the first power supply, and
turns on the second switching element so as to apply, between the gate and the source of the switching element to be driven, the second voltage from the second power supply.

5. The gate drive circuit according to claim 2, wherein when short-circuit current is flowing to the switching element to be driven, the controller interrupts the second voltage and applies, between the gate and the source of the switching element to be driven, a fourth voltage which is a negative voltage.

6. The gate drive circuit according to claim 5, further comprising:
a first gate resistor, a first switching element, and the first power supply which are connected in series to the gate of the switching element to be driven;
a second switching element and the second power supply which are connected in series to the gate of the switching element to be driven; and
a second gate resistor, a fourth switching element, and a fourth power supply which are connected in series to the gate of the switching element to be driven, wherein
the controller
turns on the first switching element so as to apply, between the gate and the source of the switching element to be driven, the first voltage from the first power supply,
turns on the second switching element so as to apply, between the gate and the source of the switching element to be driven, the second voltage from the second power supply, and
turns on the fourth switching element so as to apply, between the gate and the source of the switching element to be driven, the fourth voltage from the fourth power supply.

7. The gate drive circuit according to claim 1, wherein a timing of applying the second voltage is subsequent to completion of turn-on as a result of decrease in a voltage between a drain and the source of the switching element to be driven.

8. The gate drive circuit according to claim 1, wherein the controller includes a short-circuit current detection circuit which performs detection as to whether short-circuit current is flowing to the switching element to be driven.

9. The gate drive circuit according to claim 1, wherein the switching element to be driven is formed of a semiconductor having a wide bandgap.

10. A gate drive circuit comprising:
a controller which applies, between a gate and a source of a switching element to be driven, a gate voltage and drives the switching element;
a first gate resistor, a first switching element, and a first power supply which are connected in series to the gate of the switching element to be driven;
a second gate resistor, a fourth switching element, and a fourth power supply which are connected in series to the gate of the switching element to be driven;
a first diode, a first transistor, and a first resistor which are connected in series between the gate of the switching element to be driven and the fourth power supply; and
a second transistor having an emitter connected to the fourth power supply, the second transistor having a collector connected to the first power supply via a second resistor and a second diode, wherein
the second diode is connected to a base of the first transistor, and
the controller
turns on the first switching element so as to apply, between the gate and the source of the switching element to be driven, a first voltage from the first power supply, to turn on the switching element to be driven,
after transference of drain current of the switching element to be driven, interrupts the first voltage and turns on the second transistor so as to apply, between the gate and the source of the switching element to be driven, a second voltage that is lower than the first voltage and that is higher than a mirror voltage of the switching element to be driven, and when no short-circuit current is flowing to the switching element to be driven, interrupts the second voltage and applies, between the gate and the source of the switching element to be driven, a third voltage higher than the second voltage.

11. The gate drive circuit according to claim 10, wherein the third voltage is a voltage equal to the first voltage.

12. The gate drive circuit according to claim 10, wherein when short-circuit current is flowing to the switching element to be driven, the controller interrupts the second voltage and turns on the fourth switching element so as to apply, between the gate and the source of the switching element to be driven, a fourth voltage which is a negative voltage from the fourth power supply.

13. The gate drive circuit according to claim 10, wherein a timing of applying the second voltage is subsequent to completion of turn-on as a result of decrease in a voltage between a drain and the source of the switching element to be driven.

14. The gate drive circuit according to claim 10, wherein the controller includes a short-circuit current detection circuit which performs detection as to whether short-circuit current is flowing to the switching element to be driven.

15. A gate drive circuit comprising
a controller which applies, between a gate and a source of a switching element to be driven, a gate voltage and drives the switching element, wherein
the controller
applies, between the gate and the source of the switching element, a first voltage from a first power supply so as to turn on the switching element,
after transference of drain current of the switching element, interrupts the first voltage and applies, between the gate and the source of the switching element, a second voltage that is lower than the first voltage and that is higher than a mirror voltage of the switching element from a second power supply different from the first power supply, and
when no short-circuit current is flowing to the switching element to be driven, interrupts the second voltage and applies, between the gate and the source of the switching element, a third voltage that is lower than the first voltage and that is higher than the second voltage.

16. The gate drive circuit according to claim 15, further comprising:
a first gate resistor, a first switching element, and the first power supply which are connected in series to the gate of the switching element to be driven;
a second switching element and the second power supply which are connected in series to the gate of the switching element to be driven; and
a third switching element and a third power supply which are connected in series to the gate of the switching element to be driven, wherein
the controller turns on the first switching element so as to apply, between the gate and the source of the switching element to be driven, the first voltage from the first power supply,
turns on the second switching element so as to apply, between the gate and the source of the switching element to be driven, the second voltage from the second power supply, and
turns on the third switching element so as to apply, between the gate and the source of the switching element to be driven, the third voltage from the third power supply.

17. The gate drive circuit according to claim 15, wherein when short-circuit current is flowing to the switching element to be driven, the controller interrupts the second voltage and applies, between the gate and the source of the switching element to be driven, a fourth voltage which is a negative voltage.

18. The gate drive circuit according to claim 17, further comprising:
a first gate resistor, a first switching element, and the first power supply which are connected in series to the gate of the switching element to be driven;
a second switching element and the second power supply which are connected in series to the gate of the switching element to be driven;
a third switching element and a third power supply which are connected in series to the gate of the switching element to be driven; and
a second gate resistor, a fourth switching element, and a fourth power supply which are connected in series to the gate of the switching element to be driven, wherein
the controller
turns on the first switching element so as to apply, between the gate and the source of the switching element to be driven, the first voltage from the first power supply,
turns on the second switching element so as to apply, between the gate and the source of the switching element to be driven, the second voltage from the second power supply,
turns on the third switching element so as to apply, between the gate and the source of the switching element to be driven, the third voltage from the third power supply, and
turns on the fourth switching element so as to apply, between the gate and the source of the switching element to be driven, the fourth voltage from the fourth power supply.

19. The gate drive circuit according to claim 15, wherein a timing of applying the second voltage is subsequent to completion of turn-on as a result of decrease in a voltage between a drain and the source of the switching element to be driven.

20. The gate drive circuit according to claim 15, wherein the controller includes a short-circuit current detection circuit which performs detection as to whether short-circuit current is flowing to the switching element to be driven.

* * * * *